United States Patent
Kresge et al.

(10) Patent No.: US 6,228,470 B1
(45) Date of Patent: May 8, 2001

(54) COMPOSITE SUBSTRATE FOR ELECTRONIC COMPONENTS

(75) Inventors: John S. Kresge, Binghamton; James R. Wilcox, Vestal, both of NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/110,914

(22) Filed: Jul. 6, 1998

(51) Int. Cl.[7] .......................... B32B 15/04; B32B 15/08; B32B 15/18; B32B 15/20; B32B 27/06

(52) U.S. Cl. .......................... 428/213; 428/212; 428/421; 428/422; 428/457; 428/458; 428/463; 428/473.5; 428/901

(58) Field of Search ................................... 428/212, 213, 428/421, 422, 457, 458, 473.5, 901, 463

(56) References Cited

U.S. PATENT DOCUMENTS

| | | | |
|---|---|---|---|
| 4,830,704 | 5/1989 | Voss et al. | 156/629 |
| 5,227,338 | 7/1993 | Kryzaniwsky | 437/207 |
| 5,232,548 | * 8/1993 | Ehrenberg et al. | 156/630 |
| 5,900,312 | * 5/1999 | Sylvester | 428/322.7 |

OTHER PUBLICATIONS

G. S. Swei, W. D. Smith and D. J. Arthur, Rogers Corporation, "Ultra Thin Fluoropolymer Dielectric for MCM–L", The International Journal of Microcircuits and Electronic Packaging, vol. 16, No. 2, pp. 109–115, 2nd Qtr. 1993.

D. J. Arthur, A. Graef–Safft, G. S. Swei, Rogers Corporation, "Advanced Fluoropolymer Dielectrics for MCM Packaging", ICMCM Proceedings '92.

D. N. Light, F. J. McKiever, C. L. Tytran, H. L. Heck, IBM Corp., "High Performance Carrier Technology: Materials and Fabrication", Proceedings of the 1993 Int'l Electronic Packaging Conference 1993 P440–56.

"High Performance Carrier Technology", by Heck et al, 1993 International Electronics Packaging Conference, San Diego, California, vol. One.

"Process Considerations in the Fabrication of Teflon Printed Circuit Boards", by Light et al, 1994 Proceedings, 44 Electronic Components & Technology Conference, 5/94.

\* cited by examiner

*Primary Examiner*—Vivian Chen
(74) *Attorney, Agent, or Firm*—Ratner & Prestia

(57) ABSTRACT

A substrate having enhanced mechanical rigidity and including high stiffness reinforcing layers, a conductive layer and non-cloth dielectric layers wherein the non-cloth dielectric layers have a modulus of elasticity which is less than the modulus of elasticity of the reinforcing layers and of the conductive layer. The high stiffness reinforcing layers are disposed off the neutral axis and away from the center of the organic substrate to increase the flexural rigidity and flexural yield strength of the organic substrate.

20 Claims, 2 Drawing Sheets

COMPOSITE SUBSTRATE FOR ELECTRONIC COMPONENTS

TECHNICAL FIELD

The present invention relates, in general, to the construction of substrates for the mounting of integrated circuits and, in particular, to organic substrates having enhanced mechanical rigidity.

BACKGROUND OF THE INVENTION

Organic substrates, for example printed circuit boards and chip carriers, have been and continue to be developed for many applications. They are expected to displace ceramic chip carriers in high-end applications because of enhanced performance.

The use of organic substrates introduces new manufacturing challenges because of the inadequacy of existing manufacturing infrastructure. The tools required for the manufacture of organic chip carriers are notably different than those required for either ceramic chip carrier products or printed circuit boards.

The article "High Performance Carrier Technology: Materials and Fabrication," written by D. N. Light, F. J. McKiever, C. L. Tytran, and H. L. Heck, which was presented at the 1993 International Electronic Packaging Conference and published in Int. Electronic Packaging Society, Wheaton, Ill., provides an exemplary description of some the materials used for a substrate design and is incorporated herein by reference. Ceramic filled polytetrafluoroethylene (PTFE) (e.g., Rogers 2800™) is a leading candidate material for organic chip carriers because of good dielectric properties ($E_r$=2.8) and high temperature capability ($T_{melt}$=327 C.). This type of dielectric material is available in very thin layers (1.0 mil) which further enhances the packaging density. In addition, the compatibility of PTFE with high temperature processing permits the use of known high yield ceramic processes to form circuitry and solder dams and to attach chips. PTFE also provides a thin, low inductance cross-section with impedance matching and enables reliable via structures on grids of 10 mils or less. Yet another benefit of PTFE is a low modulus of elasticity which reduces the strain imposed on chip attach solder joints during thermal cycling of the chip-substrate assembly.

Commercial considerations make it desirable to use existing board manufacturing capability in combination with existing ceramic substrate line metallization capability to produce "hybrid" organic substrates. For example a PTFE based chip carrier which includes Rogers 2800™ material as the dielectric in the base laminate can readily have the top surface metallization done in a substrate metallization line, thus forming a package that is similar to existing ceramic packages with respect to chip assembly.

Unfortunately, the low modulus of elasticity of PTFE creates a handling challenge during the manufacture of PTFE based laminates. When compared to an equivalent thickness cross-section of a common glass-cloth reinforced dielectric such as FR-4, a PTFE based organic substrate core is an order of magnitude more compliant making it easy to deform, wrinkle, and damage during processing. Lack of flatness at assembly can also be a problem.

To control the coefficient of thermal expansion (CTE) and to improve stiffness for processing, 6 mil copper clad Invar alloy has been used at the center of the hybrid organic substrate core. (Invar is a registered trademark of IMPHY S.A., Paris, France for an "alloy which is substantially inexpansable.") Invar is an iron-nickel alloy containing approximately sixty four weight percent iron and thirty six weight percent nickel. Although Invar alloy has a relatively high modulus of elasticity, it provides minimal enhancement to overall stiffness of an organic substrate when placed at the center of the cross-section, (i.e., at the neutral axis for bending). The result is a substrate core with minimal bending stiffness and undesirably low flexural yield strength.

Although glass cloth reinforcment of the dielectric can enhance flexural rigidity and handling characteristics, it can also degrade package reliability by introducing risk sites for insulation resistance failure. Interfaces along cloth fibers can form paths of conductance between adjacent conductors in the carrier which can result in ionic migration and insultation resistance failure of the package.

An organic substrate for electronic components should have mechanical integrity and not be fragile nor tear, stretch, or wrinkle during processing. For best performance, the final cross-sectional thickness preferably should be approximately 10 to 15 mils.

SUMMARY OF THE INVENTION

An organic substrate, constructed in accordance with the present invention, includes first and second high stiffness reinforcing layers, a conductive layer disposed between the first and the second reinforcing layers, and first and second non-cloth dielectric layers disposed, respectively, between the first high stiffness reinforcing layer and the conductive layer and between the second high stiffness reinforcing layer and the conductive layer.

DETAILED DESCRIPTION OF THE INVENTION

Figure 1:
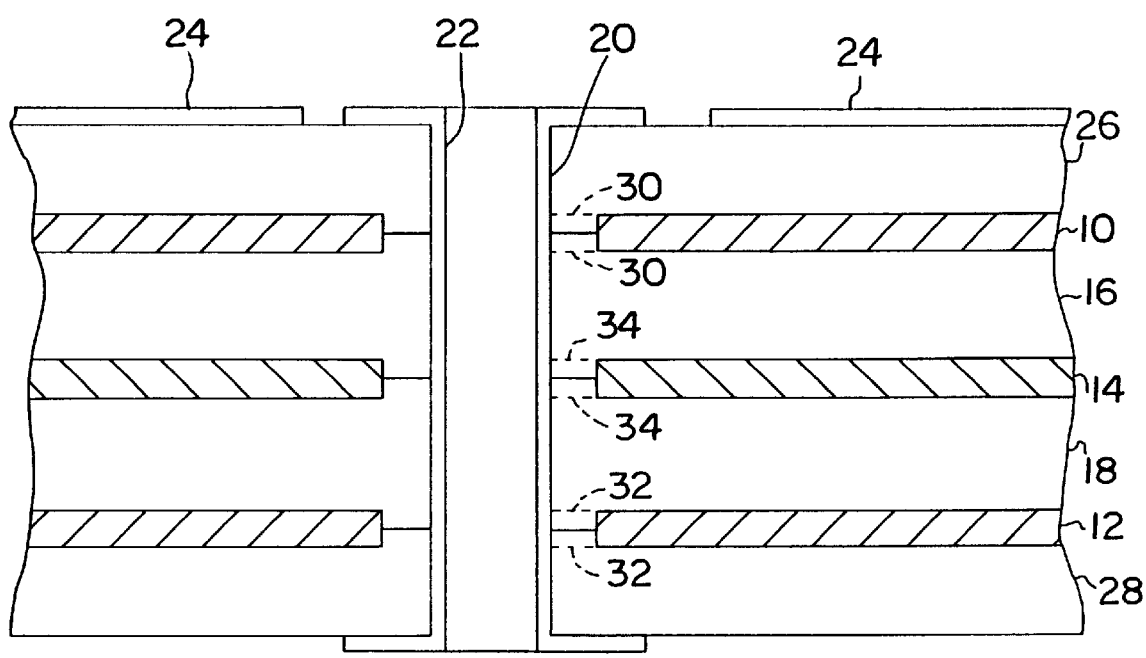
FIG. 1 is a sectional view of a first embodiment of an organic substrate constructed in accordance with the present invention.

Referring to FIG. 1, an organic substrate, constructed in accordance with the present invention, includes first and second high stiffness reinforcing layers 10 and 12. Preferably, first and second high stiffness reinforcing layers 10 and 12 have a coefficient of thermal expansion less than approximately 7 ppm/C. The first and the second high stiffness reinforcing layers can be, for example, copper clad Invar alloy, or Invar alloy mesh or molybdenum having a thickness typically between 1 and 3 mils and preferably approximately 1 or 2 mils.

An organic substrate, constructed in accordance with the present invention, also includes a conductive layer 14 disposed between first and second reinforcing layers 10 and 12. Preferably, conductive layer 14 has a coefficient of thermal expansion less than approximately $17\times10^{-6}$ PPM/C. Conductive layer 14 can be, for example, copper having a thickness typically between 0.7 and 2.1 mils and preferably approximately 1.4 mils.

An organic substrate, constructed in accordance with the present invention, further includes first and second non-cloth dielectric layers 16 and 18 disposed, respectively, between first high stiffness reinforcing layer 10 and conductive layer 14 and between second high stiffness reinforcing layer 12 and conductive layer 14. Preferably, first and second non-cloth dielectric layers 16 and 18 have a modulus of elasticity less than the modulus of elasticity of first and second high stiffness reinforcing layers 10 and 12 and less than the modulus of elasticity of conductive layer 14 such that the composite CTE of the completed substrate is in the range of 10 ppm/C. to 13 ppm/C. For optimum electrical performance, the dielectric constant of first and second non-cloth dielectric layers 16 and 18 is less than three. First and second non-cloth dielectric layers 16 and 18 can be, for example, polytetrafluoroethylene (PTFE) or polyimide having a thickness typically between 1 and 4 mils and preferably approximately 2 or 3 mils. When PTFE is chosen, it is preferably filled with particulate for increased strength, while polyimide has sufficient strength without any reinforcing filler.

With first and second high stiffness reinforcing layers 10 and 12 away from the center of the organic substrate and off the neutral bending axis, the high stiffness, high modulus material increases the cross-sectional moment of inertia, thereby increasing the flexural rigidity and bending yield strength of the organic substrate. The separation of first and second high stiffness reinforcing layers 10 and 12 can be, for example, sixteen to eighty-five percent of the total thickness of the organic substrate. The greater the separation of high stiffness reinforcing layers 10 and 12 and the respective spacings from the neutral axis of the organic substrate, the greater the flexural rigidity of the organic substrate. Experimentation has demonstrated that a separation of the high stiffness reinforcing layers of at least forty percent of the total thickness of the organic substrate provides a reasonable level of substrate rigidity through fabrication and assembly processing.

In the application of the present invention illustrated in FIG. 1, a through-hole 20, extending through the thickness of the organic substrate, has a conductive plating 22. A signal layer 24 is disposed on the top surface of the organic substrate. Third and fourth non-cloth dielectric layers 26 and 28 are disposed outward of first and second high stiffness reinforcing layers 10 and 12, respectively. As represented by dashed lines 30, 30 and 32, 32, first and second high stiffness reinforcing layers 10 and 12 may be electrically connected or in contact with conductive plating 22. Likewise, as represented by dashed lines 34, 34, conductive layer 14 may be electrically connected or in contact with conductive plating 22.

Figure 2:
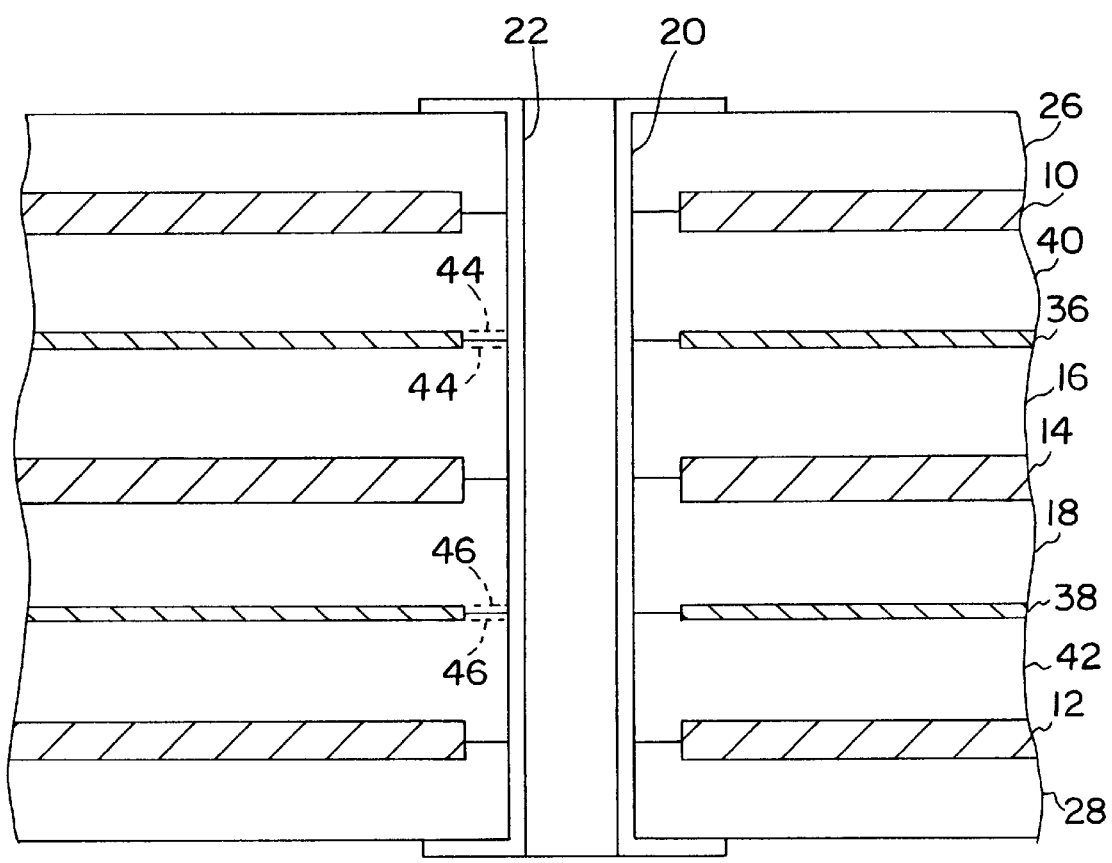
FIG. 2 is a sectional view of a second embodiment of an organic substrate constructed in accordance with the present invention.

FIG. 2 is a sectional view of a second embodiment of an organic substrate constructed in accordance with the present invention. This embodiment of the invention differs from the FIG. 1 embodiment of the invention by the inclusion of first and second internal signal layers 36 and 38 disposed outward of first and second non-cloth dielectric layers 16 and 18, respectively and fifth and sixth non-cloth dielectric layers 40 and 42, disposed, respectively, between first internal signal layer 36 and first high stiffness reinforcing layer 10 and between second internal signal layer 38 and second high stiffness reinforcing layer 12. As represented by dashed lines 44, 44 and 46, 46, first and second internal signal layers 36 and 38 may be electrically connected or in contact with conductive plating 22. Signal layers 36 and 38 typically have a thickness between 0.35 and 1.05 mils and preferably approximately 0.7 of a mil.

While in the foregoing there have been described preferred embodiments of the present invention, it should be understood by those skilled in the art that various modifications and changes can be made without departing from the true spirit and scope of the present invention.

What is claimed:

1. A substrate comprising:

first and second reinforcing layers;

a conductive layer disposed between said first and said second reinforcing layers; and first and second non-cloth dielectric layers disposed, respectively, between said first reinforcing layer and said conductive layer and between said second reinforcing layer and said conductive layer, and having a modulus of elasticity less than the modulus of elasticity of said first and said second reinforcing layers and less than the modulus of elasticity of said conductive layer.

2. A substrate according to claim 1 wherein said first and said second reinforcing layers have a coefficient of thermal expansion less than approximately 7 ppm/C.

3. A substrate according to claim 1 having a composite coefficient of thermal expansion between approximately 10 and 13 ppm/C.

4. A substrate according to claim 3 wherein said conductive layer is copper.

5. A substrate according to claim 1 further including third and fourth non-cloth dielectric layers disposed outward of said first and said second reinforcing layers, repsectively.

6. A substrate according to claim 1 further including:

(a) third and fourth non-cloth dielectric layers disposed outward of said first and said second reinforcing layers, respectively;

(b) first and second signal layers disposed outward of said first and said second non-cloth dielectric layers, respectively; and (c) fifth and sixth non-cloth dielectric layers, disposed, respectively, between said first signal layer and said first reinforcing layer and between said second signal layer and said second reinforcing layer.

7. A substrate according to claim 6 wherein said first, said second, said third and said fourth non-cloth dielectric layers are filled polytetrafluroethylene.

8. A substrate according to claim 6 wherein said first, said second, said third and said fourth non-cloth dielectric layers are polyimide.

9. A substrate according to claim 6 wherein said first and said second reinforcing layers are copper clad Invar alloy.

10. A substrate according to claim 6 wherein said first and said second reinforcing layers are Invar alloy.

11. A substrate according to claim 6 wherein said first and said second reinforcing layers are molybdenum.

12. A substrate according to claim 6 wherein the separation of said first and said second reinforcing layers is between sixteen and eighty-five percent of the total thickness of the substrate.

13. A substrate comprising:

first and second reinforcing layers;

a conductive layer disposed between said first and said second reinforcing layers; and first and second non-cloth dielectric layers disposed, respectively, between said first reinforcing layer and said conductive layer and between said second reinforcing layer and said conductive layer;

wherein:

said first and said second reinforcing layers have a coefficient of thermal expansion less than approximately 7 ppm/C., and said first and said second non-cloth dielectric layers have a modulus of elasticity less than the modulus of elasticity of said first and second reinforcing layers and less than the modulus of elasticity of said conductive layer.

14. A substrate comprising:

first and second reinforcing layers;

a conductive layer disposed between said first and said second reinforcing layers; and first and second non-cloth dielectric layers disposed, respectively, between said first reinforcing layer and said conductive layer and between said second reinforcing layer and said conductive layer;

wherein said conductive layer has a coefficient of thermal expansion less than approximately 17 ppm/C., and said first and said second non-cloth dielectric layers have a modulus of elasticity less than the modulus of elasticity of said first and said second reinforcing layers and less than the modulus of elasticity of said conductive layer.

15. A substrate according to claim 14 wherein said conductive layer is copper.

16. A substrate comprising:

first and second reinforcing layers separated by between sixteen and eighty-five percent of the total thickness of the subtsrate;

a conductive layer disposed between said first and said second reinforcing layers; and first and second non-cloth dielectric layers disposed, respectively, between said first reinforcing layer and said conductive layer and between said second reinforcing layer and said conductive layer.

17. A substrate according to claim 16 wherein the separation of said first and said second reinforcing layers is at least forty percent of the total thickness of the substrate.

18. A substrate according to claim 16 wherein said first and said second reinforcing layer are copper clad Invar alloy.

19. A substrate according to claim 16 wherein said first and said second reinforcing layers are Invar alloy.

20. A substrate according to claim 16 wherein said first and said second reinforcing layers are molybdenum.

* * * * *